US012628388B2

(12) United States Patent
Okamoto et al.

(10) Patent No.: US 12,628,388 B2
(45) Date of Patent: May 12, 2026

(54) MONOCRYSTALLINE SiC SUBSTRATES HAVING AN ASYMMETRICAL GEOMETRY AND METHOD OF PRODUCING SAME

(71) Applicant: SICRYSTAL GMBH, Nuremberg (DE)

(72) Inventors: Kuniyoshi Okamoto, Kyoto (JP); Michael Vogel, Nuremberg (DE)

(73) Assignee: SiCrystal GmbH, Nuremberg (DE)

( * ) Notice: Subject to any disclaimer, the term of this patent is extended or adjusted under 35 U.S.C. 154(b) by 235 days.

(21) Appl. No.: 18/021,567

(22) PCT Filed: Apr. 14, 2022

(86) PCT No.: PCT/EP2022/060040
§ 371 (c)(1),
(2) Date: Feb. 16, 2023

(87) PCT Pub. No.: WO2022/219129
PCT Pub. Date: Oct. 20, 2022

(65) Prior Publication Data
US 2023/0317780 A1     Oct. 5, 2023

(30) Foreign Application Priority Data

Apr. 14, 2021     (EP) ..................................... 21168352

(51) Int. Cl.
*H10D 62/10*          (2025.01)
*B28D 5/00*           (2006.01)
(Continued)

(52) U.S. Cl.
CPC ......... *H10D 62/117* (2025.01); *B28D 5/0064* (2013.01); *B28D 5/045* (2013.01);
(Continued)

(58) Field of Classification Search
CPC .... C30B 33/00; C30B 29/36; H01L 21/02005
See application file for complete search history.

(56) References Cited

U.S. PATENT DOCUMENTS 10,611,052 B1     4/2020   Bubel et al.
11,515,140 B2     11/2022  Ecker et al.
(Continued)

FOREIGN PATENT DOCUMENTS

CN          111433394 A      7/2020
JP        2010-087486 A      4/2010
(Continued)

OTHER PUBLICATIONS

US 10,421,158 B1, 09/2019, Donofrio et al. (withdrawn)
(Continued)

*Primary Examiner* — Alicia J Weydemeyer
(74) *Attorney, Agent, or Firm* — Michael Best & Friedrich LLP

(57)          ABSTRACT

The present invention provides a monocrystalline SiC substrate with an asymmetric shape for enhancing substrate stiffness against thermal induced deformations, the substrate comprising: a main region, and an asymmetric region located at a peripheral region of the substrate and adjacent to the main region, wherein the asymmetric region is inclined inwards, relative to the main region, to provide an asymmetric shape to the substrate. The present invention also provides a method of producing one or more substrates with an asymmetric shape, comprising: performing a multi-wire sawing process in which one or more substrates are cut with an wire-sawing web from an ingot placed on a stage, and cutting the one or more substrates with the asymmetric shape by controlling a relative movement between the wire-sawing web and the stage, the relative movement causing the wire-sawing web to describe a non-linear sawing path across the ingot to cut the asymmetric shape.

14 Claims, 7 Drawing Sheets

(51) Int. Cl.
  B28D 5/04 (2006.01)
  C30B 29/36 (2006.01)
  C30B 33/00 (2006.01)
  H10D 62/832 (2025.01)

(52) U.S. Cl.
  CPC .............. C30B 29/36 (2013.01); C30B 33/00 (2013.01); H10D 62/8325 (2025.01)

(56) References Cited

U.S. PATENT DOCUMENTS

| | | | | |
|---|---|---|---|---|
| 2004/0083863 | A1* | 5/2004 | Nakashima | B28D 5/045 |
| | | | | 83/13 |
| 2011/0210342 | A1 | 9/2011 | Sasaki et al. | |
| 2011/0300323 | A1* | 12/2011 | Straubinger | C30B 29/36 |
| | | | | 117/86 |
| 2012/0282443 | A1* | 11/2012 | Fujito | C01B 21/0632 |
| | | | | 117/88 |
| 2015/0376813 | A1 | 12/2015 | Tsuchida et al. | |
| 2016/0300910 | A1* | 10/2016 | Kudou | H01L 21/02024 |
| 2019/0348272 | A1 | 11/2019 | Ecker et al. | |
| 2020/0388683 | A1* | 12/2020 | Okita | C30B 33/06 |
| 2022/0025545 | A1 | 1/2022 | Vogel et al. | |

FOREIGN PATENT DOCUMENTS

| | | |
|---|---|---|
| JP | 2013049609 A | 3/2013 |
| TW | 201835393 A | 10/2018 |
| WO | 2011108706 A1 | 9/2011 |

OTHER PUBLICATIONS

Japanese Patent Office Action for Application No. 2023-513551 dated Sep. 12, 2023 (4 pages).

European Patent Office Search Report for Related Applciation No. 21168352.9 dated Sep. 24, 2021 (6 pages).

International Search Report and Written Opinion for Related Application No. PCT/EP2022/060040 dated Jul. 13, 2022 (12 pages).

U.S. Appl. No. 17/976,191 Application dated Oct. 28, 2022 (32 pages, including a statement of relevance).

U.S. Appl. No. 18/016,912 Application dated Jan. 19, 2023 (52 pages, including a statement of relevance).

Chinese Patent Office Action for Application No. 202280005650.8 dated Nov. 28, 2025 (11 pages including English machine translation).

* cited by examiner

1000

1020 wire-guiding roller wire web

Wire web movement

SiC ingot

1030

OF

Stage

1040

1010 wire-guiding roller

Wire web movement

SiC ingot

1030

Stage

1040

1030

1050

Y

X

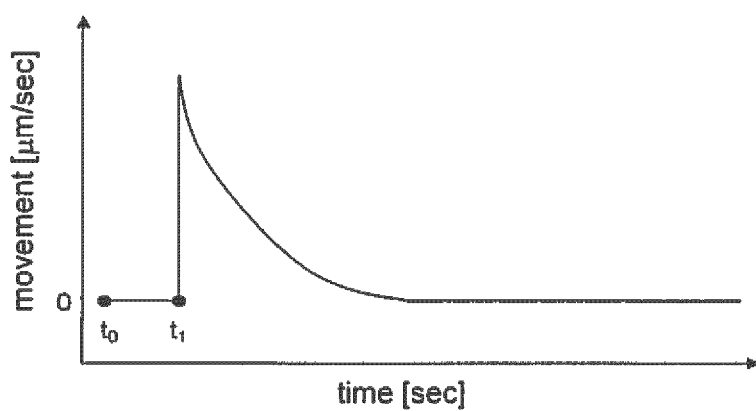
$t_0$ : wire touches the crystal
$t_1$ : wire enters the crystal by at least D/2
Fig. 14
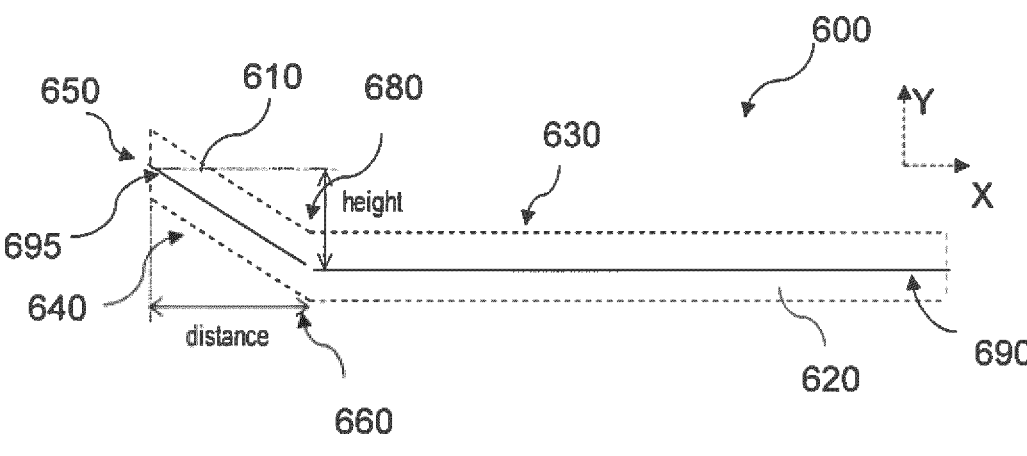
Fig. 15
Fig. 16

MONOCRYSTALLINE SiC SUBSTRATES HAVING AN ASYMMETRICAL GEOMETRY AND METHOD OF PRODUCING SAME

TECHNICAL FIELD OF THE INVENTION

The present invention relates to monocrystalline SiC substrates having an asymmetrical geometry for increasing substrate stiffness against thermally-induced internal stresses and method of producing same.

BACKGROUND OF THE INVENTION

Silicon carbide (SiC) substrates are generally used for the manufacture of electronic components. Using a suitable source material, the SiC monocrystals (also referred to as SiC ingots) are grown as standard using the physical vapour deposition (PVT) process. The SiC substrates are then made from the grown SiC monocrystals with the help of, for e.g., multi-wire saws and the surface is then refined using multi-stage polishing steps. In the subsequent epitaxial processes, thin single-crystal layers (e.g. SiC, GaN) are first deposited on the SiC substrates. The properties of these layers and the components made therefrom depend crucially on the quality of the SiC substrate.

The production of SiC crystals may be carried out by the standard method of physical vapour deposition (PVT), such as described in U.S. Pat. No. 8,865,324 B2. The raw SiC crystals obtained in this way are then oriented using e.g. X-rays in such a way that the lattice planes have the orientation required for further processing.

Through various surface processing steps, e.g. by grinding, the subsequent substrate diameter is then set on the monocrystalline SiC semi-finished product, the flat or flats are attached and the end faces of the crystal cylinders processed in this way are prepared for the separation process, e.g. multi-wire saws.

The SiC semi-finished product prepared in this way is then separated into individual raw substrates, for e.g. using a multi-wire sawing process. After a quality control, further mechanical processing of the raw monocrystalline SiC substrates takes place. For instance, after the raw substrate edges have been mechanically processed, single or multi-stage grinding or polishing processes are used to remove the interfering layer that was introduced by the separation process and to gradually reduce the roughness. A one or two-sided chemo-mechanical polishing process (CMP) is then used to set the final surface.

In the subsequent epitaxial processes, single-crystal layers of semiconductors materials (for e.g. SiC, GaN) are then deposited onto the SiC substrates. The properties of these epitaxial layers, and of the components made therefrom, depend crucially on the quality of the underlying SiC substrate. For the production of the epitaxial (EPI) layers, the geometry of the substrates in particular is of great importance. For example, the thermal coupling in an EPI reactor (crucial for homogeneous, high-quality layer growth) can only be guaranteed for panes that do not show any significant bending.

For this reason, properties of the manufactured semiconductor substrates such as bow and warp, which characterize the flatness of the substrates, are of particular concern. As standard definitions used in silicon wafers, bow measurements indicate the deviation of the centre point of the median surface of a free, un-clamped wafer from the median surface reference plane established by three points equally spaced on a circle, such as a three-point plane defined around the edge of the wafer. BOW can be negative or positive depending on whether the centre point is below or above the reference plane. Warp measurements indicate the difference between the maximum and minimum distances of the median surface from the reference plane by taking into account the entire median surface of the substrate rather than only the centre point as in bow measurements. Another important parameter of manufactured semiconductor substrates is the total thickness variation (TTV), which is the difference between the maximum and minimum thicknesses of the substrate. The median surface may be defined as the locus of points in the wafer that are equidistant between the front and back surfaces. In semiconductor epitaxial processes, the SiC substrate is in general placed on a flat plate or support, with the backside of the substrate facing the plate (i.e. the substrate side opposed to the front side of the substrate on which the epitaxial growth is intended to take place). The plate with the SiC substrate is then put into a reactor for carrying out the epitaxial process, during which temperatures of 1500° C. or higher are commonly reached. Silane and light hydrocarbons, such as propane or ethylene, diluted in hydrogen are typically used as a carrier gas to deposit a semiconductor layer(s), such as SiC layer(s), onto the front side of the SiC substrate.

Thus, if the SiC substrate is warped over its entire area, there will be an area of the substrate backside that is in contact with the plate and an area that is separated from the plate by a gap. In addition, the thermal gradients established inside the reactor (both radially and axially) for the epitaxial growth lead to a non-uniform, in-plane distribution of temperature across the SiC substrate, which may cause warping of the substrate due to thermally-induced internal stresses across the SiC substrate, and eventually, an increase of the gap between the substrate and the substrate support. As a result, the carrier gases used during the epitaxial process are also able to enter this gap, causing a non-homogeneous deposition of semiconductor material on the areas of the substrate backside of that are not in close contact with the support. The deviation of the substrate geometry from the ideal flat geometry, such as warp and total thickness variation (TTV), gets worse after the epitaxial processes due to the backside growth, causes defocusing of the subsequent photolithography process and reduced yield of the SiC devices produced from such epitaxial substrates. FIG. 1 schematically illustrates an exemplary case of a SiC substrate 100 after undergoing an epitaxial process for growing an epitaxial layer 120 on the substrate front side and where an undesired layer 130 of material has grown on the backside 140 of the substrate 100 due to warping of the substrate 100.

In the ideal case illustrated in FIG. 2, the SiC substrate 200 is initially flat and is not deformed by heating during an epitaxial process. As a result, there is no gap between the SiC substrate 200 and the plate 110 during the epitaxial process, and consequently, no deposition/growth of materials will take place on the backside of the SiC wafer 200. However, such an ideal case in which a flat SiC substrate 200 remains flat during the heating process is not observed in reality. In real conditions, SiC substrates may be already warped prior to the epitaxial process and/or develop additional warping due to the thermal gradients (axially and radially) applied during the epitaxial process. Thus, SiC backside growth is frequently observed.

FIGS. 3-5 illustrate different scenarios in which materials carried by the carrier gas become deposited on the backside of a SiC substrate during an epitaxial process for growing an epitaxial layer(s) on the front side.

FIG. 3 illustrates a case where a SiC wafer 300, which is flat prior to the heating process, acquires a convex shape (i.e. the front side of the SiC wafer 300 is curved outwards) during the heating process due to internal stress caused by the epitaxial growth conditions, with the formation of a gap 320 between a central region of the wafer 300 and the plate 110. As a result, backside growth of a layer 330 of materials transported by the carrier gas takes place during the epitaxial process.

FIGS. 4 and 5 illustrate examples where the SiC wafers 400 and 500 have concave shapes (i.e. the front side of the SiC wafers on which the epitaxial growth is intended to take place is curved inward), and therefore, a negative BOW. In the example illustrated in FIG. 4, if a SiC wafer 400 is not deformed during the heating process and already has a non-flat shape (substrate BOW is larger than 30 μm) prior to heating, there is a gap 420 between the SiC wafer 400 and the plate 110 during the epitaxial process. As a result, the carrier gas will also cause material deposition 430 on the backside of the SiC wafer 400. Referring to the example of FIG. 5, if a SiC wafer 500 is not flat prior to heating (substrate BOW is larger than 30 μm) and also undergoes thermally-induced deformation under the epitaxial growth conditions (the substrate BOW increases), the gap 520 between the SiC wafer 500 and the plate 110 will lead to backside growth 530 taking place during the epitaxial process. In particular, the development of bow of the SiC substrate 500 under heating conditions is important for backside growth. Even if the BOW at room temperature is less than 30 μm, substrate deformation can occur due to heating.

Thus, backside growth is expected to occur for SiC wafers which have a non-flat shape prior to or acquired during an epitaxial growth process and irrespectively of whether the front side surface is predominantly convex (positive BOW) or concave (negative BOW). As mentioned above, backside growth makes warp and TTV of the substrates even worse, leading to defocusing of photolithography patterns during subsequent processes of manufacturing SiC devices, and therefore, reducing yield of SiC devices produced therefrom. These disadvantages associated with SiC backside growth have been accepted in the field, as no technical solution to solve this problem has been provided so far.

Thus, there is a need for solutions that allow to prevent or at least mitigate the disadvantages associated with backside growth on SiC substrates during epitaxial processes and consequently, increase the yield of SiC devices made therefrom.

SUMMARY OF THE INVENTION

The present invention has been made in view of the shortcomings and disadvantages of the prior art, and an object thereof is to provide monocrystalline SiC substrates with an asymmetric shape, and method of producing same, that obviate or at least mitigate the above disadvantages and shortcomings of the related prior art.

This object is solved by the subject matter of the independent claims. Advantageous embodiments of the present invention are subject matter of the dependent claims.

According to a the present invention it is provided a monocrystalline SiC substrate with an asymmetric shape for enhancing substrate stiffness against thermal induced deformations, the substrate comprising: a main region; and an asymmetric region located at a peripheral region of the substrate and adjacent to the main region, wherein the asymmetric region is inclined inwards, relative to the main region, to provide an asymmetric shape to the substrate.

In a further development, the asymmetric region is delimited between a substrate rim and the main region, and the asymmetric region joins the main region in a continuous manner, the inclination between the asymmetric and main regions defining an elbow or shoulder in the asymmetric shape of the substrate.

In a further development, the asymmetric region is so dimensioned and inclined inwards, relative to the main region, such that a maximum height of a substrate rim that delimits the asymmetric region is in the range of 15 μm to 60 μm, and is preferably 25 μm, with respect to a reference plane of the main region.

In a further development, said maximum height corresponds to a maximum height at an intersection of a reference plane of the asymmetric region with the substrate rim that delimits the asymmetric region, with respect to the reference plane of the main region.

In a further development, the asymmetric region is so dimensioned and inclined inwards, relative to the main region, such that a maximum distance between a projection, onto a reference plane of the main region, of a substrate rim that delimits the asymmetric region and the main region is in the range 5 mm to 30 mm, and is preferably 15 mm.

In a further development, the reference plane of the main region corresponds to a median surface of the substrate without the peripheral region of the substrate, and/or the reference plane of the asymmetric region corresponds to a median surface of the asymmetric region.

In a further development, the asymmetric region is located on a substrate peripheral area that is opposed to an orientation flat or notch in the substrate, and the angular displacement of the asymmetric region is between ±90°, preferably ±60°, with respect to the orientation flat or notch.

In a further development, the asymmetric region is so dimensioned and inclined inwards, relative to the main region, such that a maximum height of a substrate rim that delimits the asymmetric region, with respect to a Si-side of the substrate at the main region, is a positive height.

In a further development, the substrate formed by the main and asymmetric regions is characterized by: a BOW value in the range of –40 μm to 0 μm, preferably in the range of –35 μm to 0 μm, and/or a WARP value of less than 70 μm, preferably the WARP value is 45 μm.

In a further development, the thickness of the asymmetric and main regions is in the range of 200 μm to 1000 μm, preferably in the range of 250 μm to 500 μm, and/or the substrate has a partial cylindrical shape, at the main region, with a diameter d larger than 149.5 mm, and/or the substrate has a total thickness variation smaller than 5 μm, and/or the asymmetric and main regions of the substrate are formed from a single piece of a SiC monocrystal in one of the modifications 4H-SiC, 6H-SiC, and 15R-SiC, and/or at the main region, the SiC crystal structure has an α° off-axis orientation of the basal plane (1000) which is between 0.5° to 8° off-axis orientation, preferably with a 4° off-axis orientation.

In a further development, the main region has a substantially flat surface, and/or said asymmetrical region has the shape of a circular segment delimited between the adjacent main region and the substrate rim; and/or wherein said asymmetrical region has a substantially flat shape or a non-flat shape with a convex or a concave curvature.

The present invention also provides a method of producing one or more substrates with an asymmetric shape, the method comprising: performing a multi-wire sawing process in which one or more substrates are cut with an wire-sawing web from an ingot placed on a stage, and cutting the one or more substrates with the asymmetric shape by controlling a relative movement between the wire-sawing web and the stage, the relative movement that causes the wire-sawing web to describe a non-linear sawing path across the ingot to cut the asymmetric shape.

In a further development, controlling the relative movement between the wire-sawing web and the stage includes: controlling the wire-sawing web to move towards the stage along a linear sawing direction; and controlling the stage to move in a direction perpendicular to the sawing direction, in coordination with the movement of the wire-sawing web, such as to cause the wire-sawing web to describe said non-linear sawing path across the ingot, or controlling the wire-sawing web to move in a direction perpendicular to the sawing direction, in coordination with the movement in the sawing direction, such as to cause the wire-sawing web to describe said non-linear sawing path across the ingot.

According to a further development, the method comprises: controlling the stress applied on the wires of the wire-sawing web during the multi-wire sawing process by controlling the relative movement, in the direction perpendicular to the sawing direction, between the wire-sawing web and the stage to start after the wires of the wire-sawing web have entered into the ingot by at least half of the wire diameter in the sawing direction.

In a further development, the selected asymmetric shape includes an asymmetric region at a peripheral area of the substrate, adjacent to a main region of the substrate which is substantially flat, the selected asymmetric shape being cut by controlling time duration and amount of displacement of the relative movement, in the direction perpendicular to the sawing direction, between the wire-sawing web and the stage, wherein the time duration of the relative movement in the direction perpendicular to the sawing direction determines a maximum distance between the substrate rim at the asymmetric portion and the main region, along the sawing direction, and wherein the amount of displacement of the relative movement in the direction perpendicular to the sawing direction determines a maximum height of the asymmetric region with respect to the main region.

The accompanying drawings are incorporated into and form a part of the specification for the purpose of explaining the principles of the invention. The drawings are not to be construed as limiting the invention to only the illustrated and described examples of how the invention can be made and used.

BRIEF DESCRIPTION OF THE FIGURES

Further features and advantages will become apparent from the following and more detailed description of the invention as illustrated in the accompanying drawings, in which:

FIG. 14 depicts graphically speed as a function of time of the relative motion between the wire-sawing web and the stage, in a direction perpendicular to the linear movement of the wire-sawing web towards the stage, during the controlled motion procedure according to embodiments of the present invention;

FIG. 15 shows, schematically, parameters of the asymmetric shape (maximum distance and maximum height of the asymmetric region) of the SiC substrate shown in FIG. 6 that are set by controlling time duration and amount of displacement of the relative movement between a wire-sawing web and a stage during a MWS process according embodiments of the present invention; and FIG. 16 shows, schematically, a cross-section view of a SiC substrate with irregular thickness and reference plane used to define the parameters of the asymmetric shape (maximum distance and maximum height of the asymmetric region).

Figure 1:
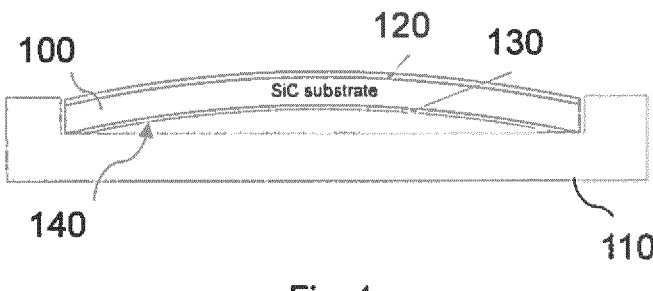
FIG. 1 is a cross sectional view showing a warped monocrystalline SiC substrate on a support plate, after an epitaxial process for growing an epitaxial layer(s) on a front side of the substrate and during which material has been grown on a backside of the substrate due to the gap between the substrate backside and the support plate.
Figure 2:
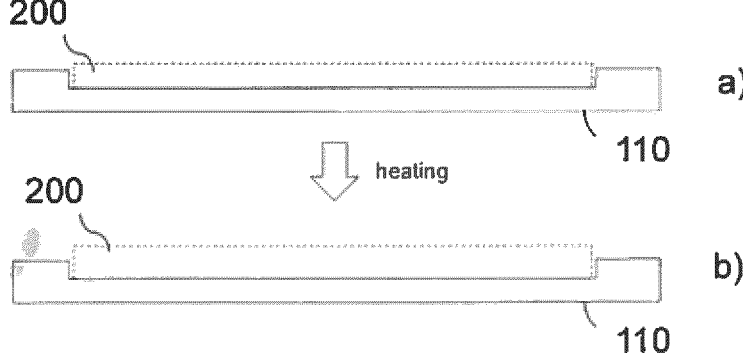
FIG. 2 are cross sectional views showing a SiC substrate in an ideal case, where: a) the SiC substrate has a substantially flat shape prior to a heating process; and b) the flat shape is maintained during the heating process, so that no gap appears between the backside of the substrate due to warping.
Figure 3:
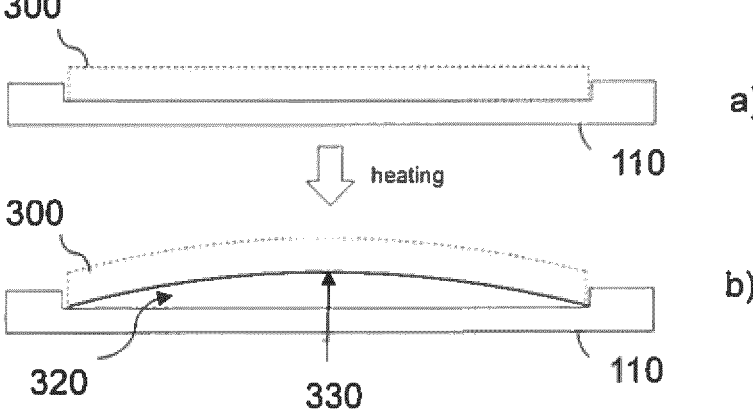
FIG. 3 are cross sectional views showing warping of a conventional SiC substrate in a scenario, where: a) the SiC substrate lies substantially flat on the support plate prior to a heating process; and b) the SiC substrate shape is deformed during the heating process, leading to appearance of a gap between substrate backside and the support plate and consequent material deposition on the substrate backside.
Figure 4:
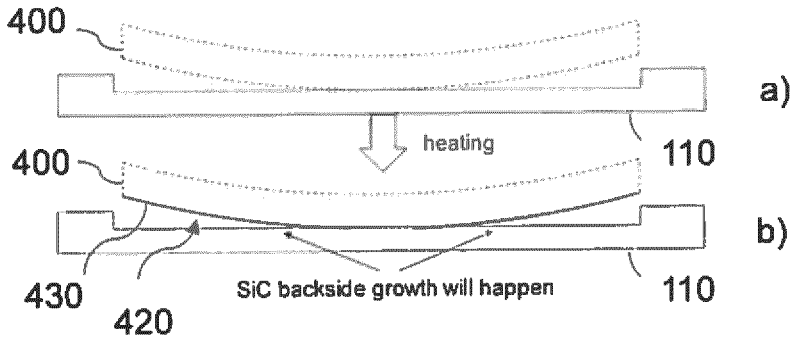
FIG. 4 are cross sectional views showing warping of a conventional SiC substrate in a scenario, where: a) the SiC substrate is warped prior to a heating process, leading to a gap between the substrate backside and the support plate; and b) the SiC substrate shape is not deformed during the heating process but backside growth still takes place.
Figure 5:
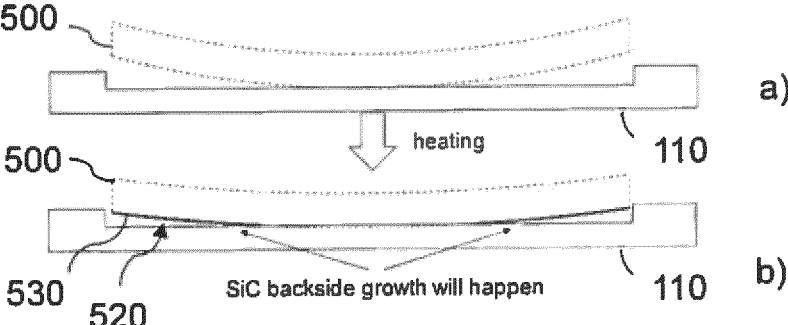
FIG. 5 are cross sectional views showing warping of a conventional SiC substrate in a scenario, where: a) the SiC substrate is warped prior to a heating process, leading to the presence of gap between the SiC substrate and the support plate; and b) the initial SiC substrate shape is deformed during the heating process, backside growth taking place on the increased areas which are not in direct contact with the support plate.

It is noted that the dimensions and relative angles shown in the drawings are only intended for the purpose of understanding the invention and are not drawn to scale.

DETAILED DESCRIPTION OF THE INVENTION

The present invention will now be more fully described hereinafter with reference to the accompanying drawings, in which exemplary embodiments of the invention are shown. The present invention may, however, be embodied in many different forms and should not be construed as limited to embodiments set forth herein. Rather, these embodiments are provided so that the disclosure will be thorough and complete, and will fully convey the scope of the invention to those skilled in the art. Like numbers refer to like elements throughout.

A principle underlying the present invention lies in reducing the negative impact of backside growth onto parameters of SiC wafers, such as BOW, warp and TTV, which are crucial for the quality of the epitaxy processes and manufacture of SiC devices, by improving stiffness of the SiC substrate against deformations caused by thermal gradients, such as those applied to SiC substrates (both radially and axially) during conventional epitaxial growth processes. The improvement of stiffness is achieved by designing a SiC substrate with a specific asymmetric shape, at a peripheral region of the substrate, which counteracts the development of thermally-induced internal stresses across the SiC substrate, while localizing any eventual backside growth at the peripheral area of the substrate.

More specifically, the substrate stiffness may be improved by an asymmetric geometry in which a peripheral part of the substrate is inclined upwards towards a front side of the substrate onto which the epitaxial growth is to take place, such as described in the following with reference to FIG. 6.

Figure 6:
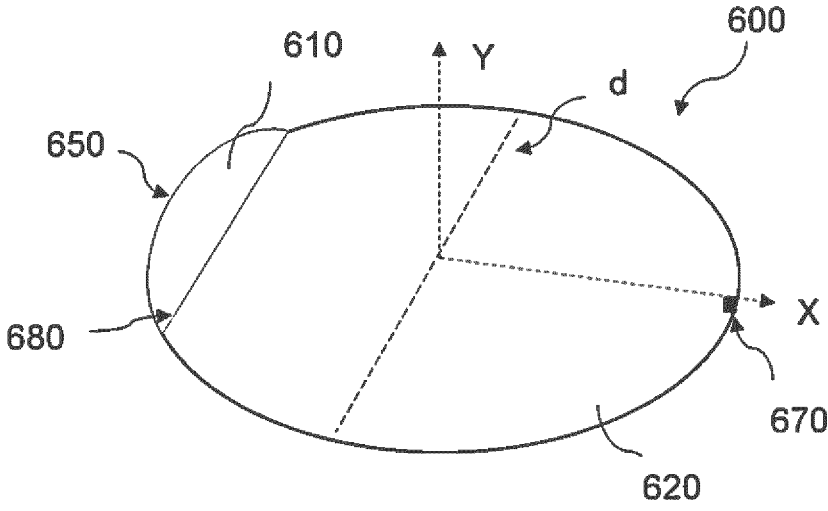
FIG. 6 shows, schematically, a perspective view of a SiC substrate with an asymmetric shape according to an embodiment of the present invention.

FIG. 6 shows a schematic perspective view of a SiC substrate 600 with an asymmetrical shape that improves stiffness against thermally-induced deformations. As shown in FIG. 6, the asymmetrical shape is provided by a substrate region 610, located at a peripheral area of the SiC wafer 600 and adjacent to a main region 620 of the substrate 600, which is inclined inwards, i.e. towards a front side 630 of the SiC substrate 600 (i.e. in the Y-direction shown in FIG. 6). The main region 620 essentially corresponds to the remaining part of the SiC substrate 600, without the asymmetric region 610, and is preferably flat. The asymmetric region 610 joins the main region 620 in a continuous manner, so that the asymmetric region 620 is delimited between the substrate rim 650 and the main region 620, the inclination between the asymmetric region 610 and main region 620 defining an elbow or shoulder 660 in the asymmetric shape of the substrate 600. The out-of-plane orientation of the asymmetric region 610 with respect to a reference plane of the main region 620 (which is parallel to the X-direction in FIG. 6) introduces an asymmetry in the substrate cross-section that counter-acts thermally-induced deformations of the SiC wafer 600. As a result, the larger area of the substrate 600 covered by the central, main region 620 remains flat and the appearance of gaps between the main region 620 and the plate support is avoided during heating processes, such as those conventionally used in semiconductor epitaxial processes. Consequently, due to the increased stiffness provided by the non-symmetrical shape of the SiC substrate 600, substrate warping during heating processes can be reduced and backside growth can be eliminated or significantly reduced.

Figure 7:
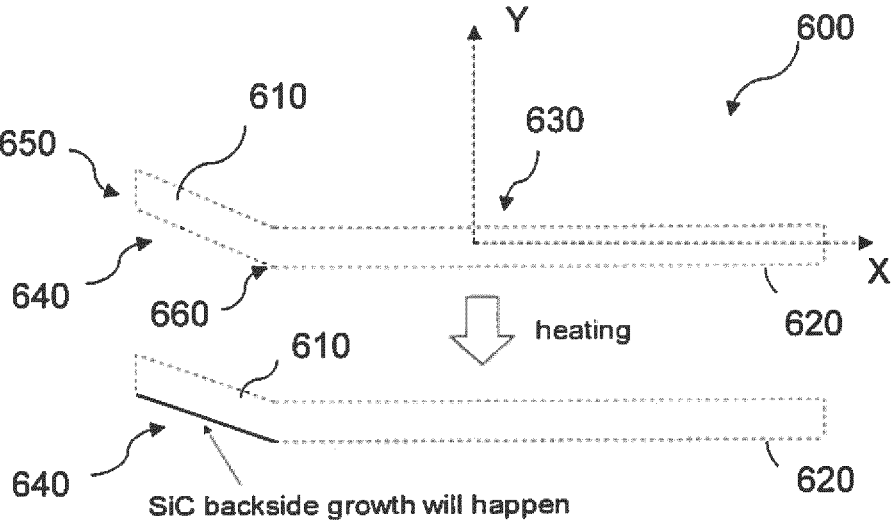
FIG. 7 are cross sectional views of the SiC substrate shown in FIG. 6, showing a L-like shaped cross-section with sharp elbow and in which: a) shows a cross-section of the SiC substrate with the asymmetric shape, prior to a heating process; and b) shows a cross-section of the SiC substrate after undergoing a heating process and where backside growth takes place at the asymmetric region of the SiC substrate area only.

FIG. 7 illustrates the cross-section of the asymmetric SiC substrate 600 shown in FIG. 6, before and after the substrate 600 undergoes heating during an epitaxial growth process (the epitaxial layer on the front side 630 of the substrate 600 have been omitted in FIG. 7 for simplicity reasons). As shown in FIG. 7, due to the separation between the asymmetric region 610 and the substrate support (not shown), backside growth may occur close to the substrate rim 650. However, the increased stiffness provided by the asymmetric shape prevents backside growth at the central region of the substrate 600 because no gap is developed between the main region 620 and the substrate support during the epitaxial growth process. As a result, the negative impact of backside growth on substrate BOW is significantly reduced. Furthermore, the substrate asymmetrical shape shifts backside growth to a substrate peripheral area that has less negative impact on BOW after epitaxy. A further advantage of backside growth being localized at the peripheral area of the substrate 600, i.e. at the asymmetric region 610, is that this region can be easily discarded after the epitaxial process. Thus, SiC devices can be manufactured from the main region 620 of the substrate 600 without the undesirable effects associated with warp, bow and backside deposition observed in conventional SiC substrates. As a result, a higher yield of SiC devices made from the epitaxial materials deposited/grown on the main region 620 of the asymmetrical substrate 600 may be achieved.

The inclination of the asymmetric region 610 may be characterized as an inclination of a median surface of the asymmetric region 610 with respect to the reference plane 690 of the main region 620 so as to compensate for substrate thickness irregularities. In case the substrate 600 is provided with an orientation flat or notch 670, the asymmetric region 610 is preferably located on a peripheral area of the substrate 600 that is opposed to the orientation flat or notch 670. For instance, the asymmetric region 610 may be directly opposed to the notch 670, as shown in FIG. 6, or within an angular displacement between ±90°, preferably ±60°, with respect to the orientation flat or notch 670. In the later case, intermediate points of the asymmetric region 610 and/or orientation flat are used for defining the angular displacement.

The principles underlying the improvement of substrate stiffness by the asymmetric shape described above are applicable to a wide range of diameters and thicknesses of SiC substrates, namely, to SiC substrates characterized by one or a combination of the following parameters: a diameter d larger than 149.5 mm, substrate thickness (in the asymmetric and main regions) in the range 200 μm to 1000 μm, preferably in the range 250 μm to 500 μm, and total thickness variation (TTV) smaller than 5 μm. The diameter d of the asymmetric SiC substrate 600 may be defined as the diameter d of the (partially) cylindrical shape of the main region 620, i.e. without the circular segment corresponding to the asymmetric region 610.

In an advantageous configuration of the SiC substrate 600, the front side 630 of the main region 620 is the Si-side of the SiC monocrystal. The asymmetric region 610 is then inclined inwards with respect to the front side 630 such that the maximum height of the substrate rim 650, which delimits the asymmetric region 610, with respect to the reference plane 690 of the main region 620 is a positive height (for e.g. see FIG. 15).

Suitable parameters of the asymmetric shape for improving substrate stiffness may be selected/determined based on simulation analysis and/or by means of experimentation taking into account the desired dimensions of the SiC substrate and temperature conditions to which the asymmetric substrate will be submitted during an epitaxial growth process. For instance, for a SiC substrate 600 with a diameter larger than 149.5 mm, the increase of substrate stiffness can be achieved by providing the asymmetric region 610 with dimensions and inward inclination, relative to the main region 620, such that a maximum height of the substrate rim 650 that delimits the asymmetric region 610 is in the range of 15 μm to 60 μm, preferably 25 μm, with respect to the reference plane of the main region 620. In this case, the maximum height may be defined as a maximum height between the reference plane 695 of the asymmetric region 610 at the highest point of the substrate rim 650 that delimits the asymmetric region 610, with respect to the reference plane 690 of the main region 620. The maximum distance between the side 680 of the asymmetric region 610 adjacent to the main region 620 and a projection of the substrate rim 650 that delimits the asymmetric region 610 onto the reference plane 690 of the main region 620 is preferably in the range 5 mm to 30 mm, and is most preferably 15 mm. The maximum distance and maximum height for the asymmetric substrate 600 may be defined as illustrated in FIG. 15, in which the reference plane of the main region 620 corresponds to the median surface 690 of the substrate 600, without the asymmetric region 610. The reference plane of the asymmetric region 610 may be defined as a median surface 695 of the asymmetric region 610.

In the asymmetric shape shown in FIGS. 6 and 7, the asymmetric and main regions 610, 620 have substantially flat surfaces and form a L-like shaped cross-section with a sharp elbow 660. The L-like shaped cross-section has the technical advantage of deforming less during the epitaxial process due to the increased stiffness. Furthermore, as the main region 620 is substantially flat and corresponds to a significant area of the SiC substrate 600, the L-like shape prevents backside growth over a large area of the SiC substrate 600 because most of the area on the backside 640 remains in contact with the support during epitaxial growth processes. Consequently, the overall area of the SiC substrate 600 that is affected by backside growth during epitaxial growth processes is significantly minimized.

Nonetheless, other asymmetric shapes with an asymmetric region of other geometries may be adopted. For instance, FIGS. 8 and 9 illustrate possible geometries of the asymmetric region that share the common principle of being provided at a peripheral region of the substrate and inclined upwards, with respect to the front side of the main region.

Figure 8:
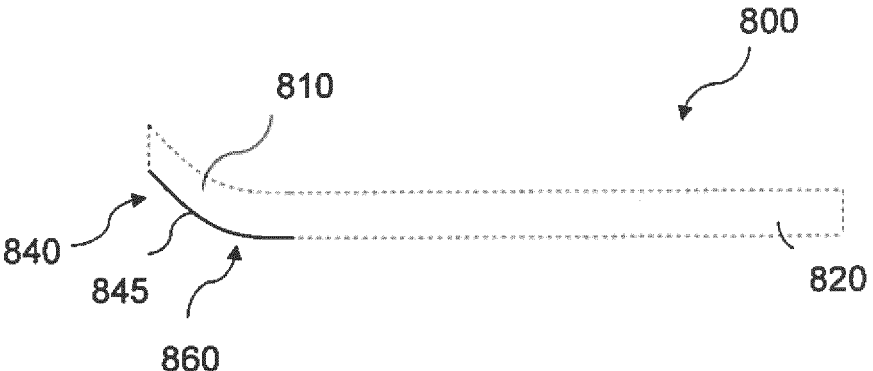
FIG. 8 shows, schematically, a cross-section view of a SiC substrate with an asymmetric shape (L-like shape with rounded elbow) according to another embodiment of the present invention.

FIG. 8 illustrates a cross-section of an asymmetric SiC substrate 800 formed with an asymmetric region 810 defined with a surface which is approximately flat, close to the substrate rim, and which becomes progressively curved (concave) close to the main region 820, thereby defining a L-like shape cross-section with a rounded elbow or shoulder 860 on the backside 840 of the SiC substrate 800. Due to the improved stiffness provided by this asymmetrical shape, the main region 820 maintains its substantially flat shape during epitaxial growth processes and therefore, backside growth 845 is localized on the backside 840 of the asymmetric region 810 only.

Figure 9:
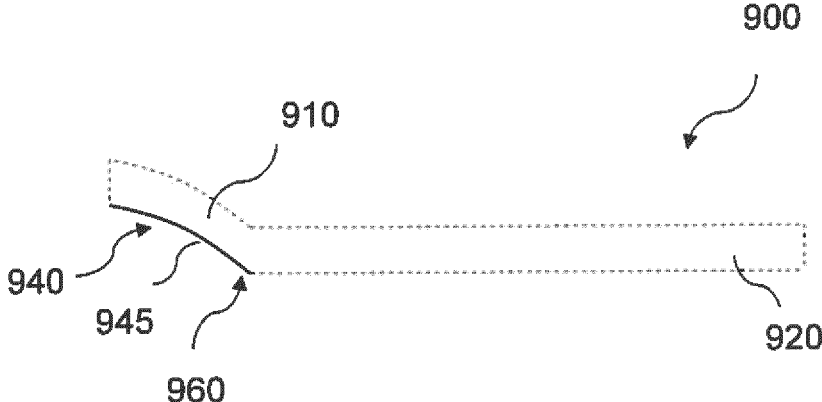
FIG. 9 shows, schematically, a cross-section view of a SiC substrate with an asymmetric shape (L-like shape with convex leg) according to another embodiment of the present invention.

FIG. 9 illustrates another example of an asymmetric shape of a SiC substrate 900 for increasing substrate stiffness. In this configuration, the asymmetric shape is designed with a main region 920, which is substantially flat, and an asymmetric region 910 that is inclined upwards, relative to the main region 920, and shaped with a slight convex curvature. The surface of the main region 920 also remains substantially flat during heating processes due to increase stiffness, so that backside growth 945 is limited to the backside 940 of the asymmetric region 910.

The parameters of the asymmetric region described above with reference to the asymmetric substrate 600, such as maximum height between reference planes of the asymmetric and main region, maximum distance from the rim of the asymmetric region, etc., are also applicable to the asymmetric shapes shown in FIGS. 8 and 9.

SiC wafer(s) having an asymmetric shape according to the principles of the present invention may be produced from a monocrystalline SiC crystal or ingot using wafer separation techniques, such as a multi-wire sawing (MWS) process with a controlled motion procedure that controls the movement of the wire-sawing web and/or the movement of the ingot stage in a coordinated manner to cut the SiC wafer(s) with the desired asymmetric shape.

Figure 10:
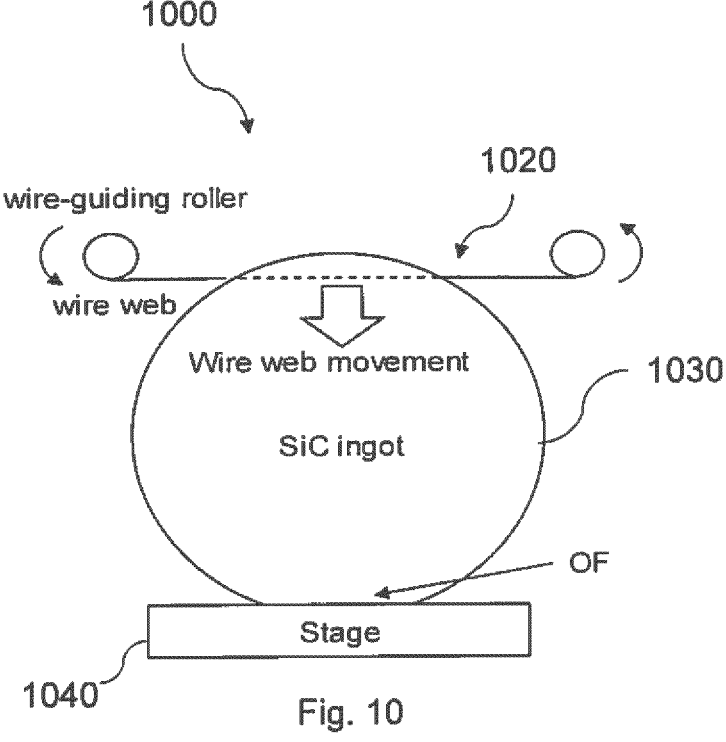
FIG. 10 illustrates, schematically, a SiC ingot placed on a stage of a conventional multi-wire sawing installation for cutting SiC wafers from the SiC ingot (viewed from a front side of the ingot)
Figure 11:
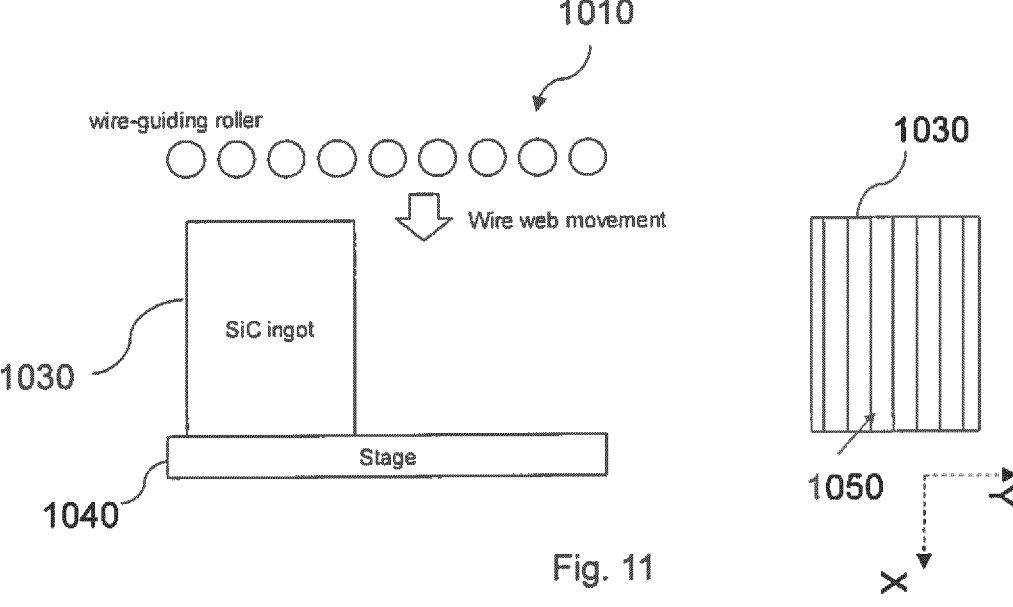
FIG. 11 illustrates, schematically, the vertical movement of the wire-sawing web of the multi-wire sawing installation depicted in FIG. 10 (viewed from a lateral side of the SiC ingot), which results in the SiC wafers being cut with the conventional flat geometry.

Multi-wire sawing is conventionally used for producing SiC substrates from a SiC crystal or ingot. The working principle of a conventional multi-wire sawing installation 1000 is illustrated in FIGS. 10 and 11. In the conventional multi-wire sawing installation 1000, a single sawing wire is wound on wire-guiding rollers 1010. Each wire-guiding roller 1010 is grooved at a constant pitch, the arrangement of the sawing wire on the spaced apart grooves forming a horizontal web 1020 parallel to the wires. During the multi-sawing process, the slurry (a suspension of abrasive particles in coolant fluid) is fed onto the moving wires, which transport the slurry into the cutting zone. The material to be cut, such as a SiC ingot 1030, is fixed to a stage 1040 and the wire-sawing web 1020 moved down from top of the crystal 1030 placed on the stage 1040 for cutting wafers 1050 therefrom. The entire wire-sawing web 1020 is moved at a constant speed in a vertical direction. The motion of the wire-sawing web 1020 towards the stage 1040 pushes the crystal 1030 through the wire-sawing web 1020, producing a large number of wafers 1050 simultaneously. As the wire-sawing web 1020 can only be moved in the direction transverse to the stage surface, the wafers 1050 are cut with a flat surface (i.e. a cross-section with symmetric geometry).

The present invention uses a modified MWS method with a controlled motion procedure that controls the relative movement between the wire-sawing web and the stage in two dimensions: the linear sawing direction of the wire-sawing web and in the direction perpendicular to the sawing direction. The relative movement between the wire-sawing web and the stage is coordinated such as to cause the wire-sawing web to describe a non-linear sawing path across the ingot cross-section (i.e. in two dimensions), which results in one or more substrates being directly cut with the desired asymmetric shape. Such a non-linear sawing path may be achieved using two alternative controlled motion procedures, such as it will be described with reference to FIGS. 12 and 13.

Figure 12:
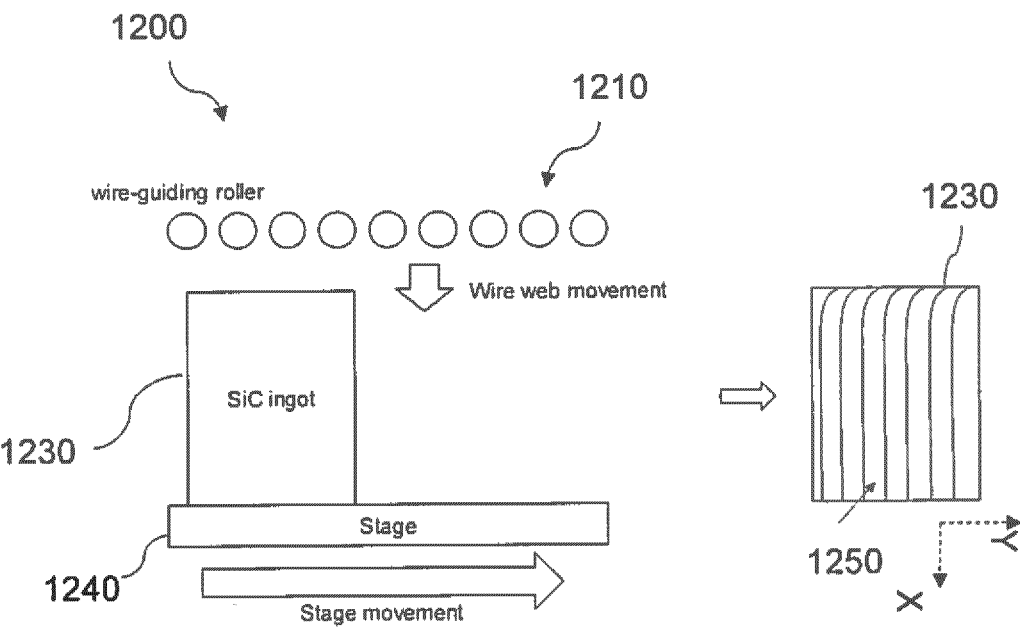
FIG. 12 illustrates, schematically, a multi-wire sawing installation with a controlled motion of the wire-sawing web and the stage onto which an ingot is placed for cutting SiC wafers with an asymmetric geometry according to an embodiment (viewed from a lateral side of the ingot)

FIG. 12 illustrates a MWS installation 1200 that performs a controlled motion procedure in which a stage 1240, on which an ingot 1230 is placed, is controlled to move relative to a wire-sawing web 1210 to cause the wire-sawing web 1210 to describe a non-linear, asymmetrical sawing path across the ingot 1230 to cut substrates 1250 with a desired asymmetric shape, such as the asymmetric shape shown in FIG. 8. In the controlled motion procedure, the wire-sawing web 1210 is controlled to move towards the stage 1240 along a linear sawing direction (which is the direction of the vertical arrow in left-hand side of FIG. 12 or the X-direction shown in the inset on the right-hand side of FIG. 12). The wire-sawing web 1210 continues to be moved linearly in this same linear sawing direction during the whole MWS process. In order to make the wire-sawing web 1210 describe the non-linear, asymmetrical sawing path across the ingot 1230, the stage 1240 is controlled to move in a direction perpendicular to the movement direction of the wire-sawing web 1210 (which is the direction of the horizontal arrow in the left-hand side of FIG. 12, parallel to the Y-direction shown in the inset on the right-hand side of FIG. 12). The specific asymmetric shape of the substrates 1250 is achieved by coordinating the movement of the stage 1240 with the linear movement of the wire-sawing web 1210, for e.g. by adjusting the speed (or amount of displacement) and time duration of the stage movement with respect to the speed of the wire-sawing web 1210 (or vice-versa), which is preferably constant. For instance, substrates 1250 with the L-like shape illustrated in the right-hand side of FIG. 12 may be obtained by controlling the wire-sawing web 1210 to move at constant speed in the linearly sawing direction during the whole MWS process (i.e. in the X-direction shown on the right-hand side of FIG. 12), while the stage 1240 is controlled to move in the direction perpendicular to the movement direction of the wire-sawing web 1210 for a limited amount of time sufficient for the wire-sawing web 1210 to cut the inclined leg of the L-like shape of the substrates 1250. The movement of the stage 1240 is then stopped, while the movement of the wire-sawing web 1210 in the linear sawing direction is maintained, so as to cut the straight leg in the L-like shape of the substrates 1250.

The controlled motion procedure may control the stress imposed on the wire of the wire-sawing web 1210 by moving only the wire-sawing web 1210 towards the stage 1240 (along the vertical sawing direction) at the beginning the MWS process and until the wire has entered the ingot 1230 by at least a depth of D/2, i.e. half of the wire diameter D. After this point, the stage 1240 may start moving in the direction perpendicular to the vertical sawing direction, while the wire-sawing web 1210 continues the vertical motion towards the stage 1240, preferably at constant speed.

FIG. 14 exemplifies the speed of the stage 1240 as a function of time (i.e. in a direction transverse to the vertical motion of the wire-sawing web 1210) during the controlled motion procedure for producing the substrates 1250 with the rounded L-like shaped cross-section and including control of the wire stress. In FIG. 14, the instant $t_0$ corresponds to the time at which the wire of the wire-sawing web 1210 touches the ingot 1230, which can be detected by known means, such as dedicated sensors. At this instant $t_0$, the stage 1240 is still in a halt state and remains without moving until instant $t_1$, at which the wire of the wire-sawing web 1210 has entered the ingot 1230 by at least D/2. At instant $t_0$, the controlled motion procedure starts the movement of the stage 1240 in the direction perpendicular to the sawing direction and coordinates the stage movement with the speed of the wire-sawing web 1210 so as to cut the substrates 1250 with the desired asymmetric shape. For instance, as shown in FIG. 14, the stage 1240 may be initially moved with a higher speed, which will determine the initial slope of the asymmetric region with respect to the main region. The speed of the stage movement may then be gradually decreased, while maintaining a constant speed of the wire-sawing web 1210, which results in the curved elbow or shoulder of the substrates 1250. Once the asymmetric region of the substrates 1250 has been cut, the controlled motion procedure stops the stage 1240. From this point on, the controlled motion procedure maintains only the movement of the wire-sawing web 1210 in the vertical sawing direction and which is only stopped when the wire-sawing web 1210 reaches the stage 1240, so as to fully cut the main region of the substrates 1250 across the ingot 1230.

Different types of asymmetric shapes may be achieved using the MWS method with controlled motion procedure described above by adjusting the function of speed vs. time of the stage movement and the speed of the wire-sawing web 1210. For instance, the asymmetric shape of the SiC substrate 600 shown in FIG. 6, in which both the asymmetric region 610 and the main region 620 have flat surfaces, may be produced by maintaining the stage relative movement at substantially constant speed in the direction perpendicular to the movement of the wire-sawing web 1210 during the time necessary for cutting the asymmetric region 610.

Consequently, a specific size, shape and inclination of the asymmetric region can be achieved by simply controlling a combination of total time duration and displacement of the stage movement. As shown in FIG. 15 for the substrate 600, the maximum distance between the substrate rim 650 that delimits the asymmetric region 610 and the end of the asymmetric region 610 (which approximately corresponds to the onset of an elbow 660 at the region of the substrate 600 where the asymmetric and main regions 610, 620 meet) when measured along the reference plane 690 of the main region 620 is determined by the total displacement of the wire-sawing web 1210 in the wire-sawing direction during the time interval that the stage 1240 is controlled to move. Thus, this maximum distance can be set by adjusting the time duration of the stage movement based on the speed of the wire-sawing web 1210. On the other hand, the maximum height between the substrate rim 650, at the asymmetric region 610, and the reference plane 690, at the region of the substrate elbow 660, is determined by the total displacement of the stage 1240. Both the maximum distance and maximum height are preferably defined with respect to the median surface 690 of the main region 620 and the median surface 695 of the asymmetric region 610. This allows to set the maximum distance and height of the controlled motion procedure in a uniform manner for different substrates thicknesses. It also allows to define a reference plane that takes into account irregularities in substrate thickness, such as the reference plane 790 in the substrate 700 with asymmetric shape illustrated in FIG. 16.

Figure 13:
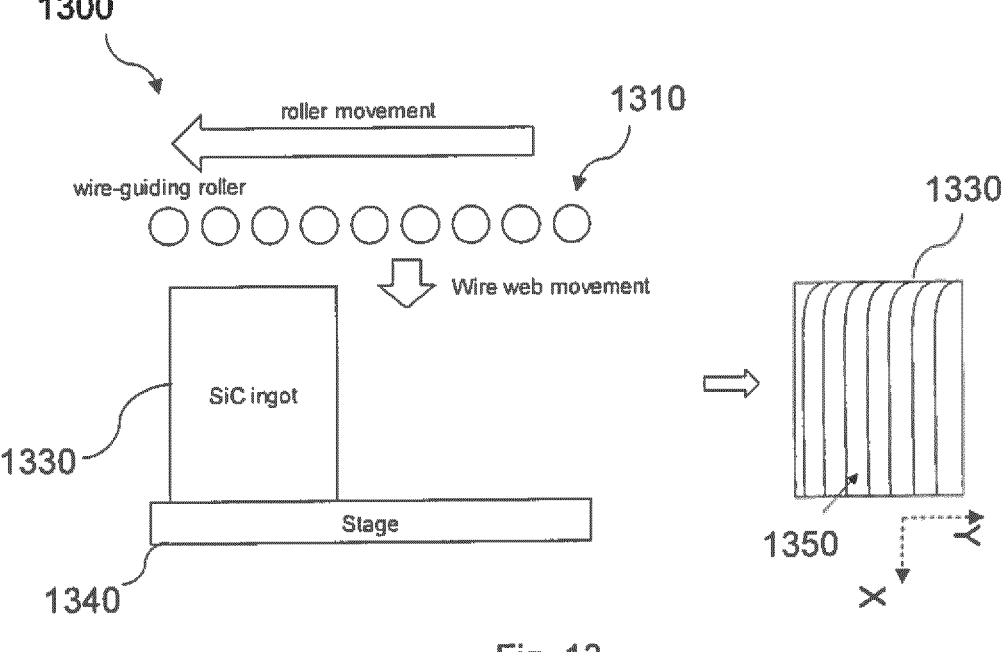
FIG. 13 illustrates, schematically, a multi-wire sawing installation with a controlled motion of the wire-sawing web in two dimensions relative to the stage onto which an ingot is placed for cutting SiC wafers with an asymmetric geometry according to another embodiment (viewed from a lateral side of the ingot)

A further example of a MWS method with a controlled motion procedure for producing SiC substrates 1350 with an asymmetrical shaped cross-section is illustrated in FIG. 13. Referring to FIG. 13, the MWS installation 1300 performs a controlled motion procedure which differs from the procedure described above with reference to FIG. 12 in that the asymmetric sawing path across the SiC ingot 1330 is achieved by controlling the movement of a wire-guiding roller 1310 in both vertical and transversal directions, while the stage 1340 is not moved during the MWS process. More specifically, in order to reduce stress on the sawing wires, the movement of the wire-sawing web 1310 (i.e. the wire-guiding roller) is initially controlled to move towards the stage 1340 in a linear direction (i.e. in the direction of the vertical arrow in the left-hand side of FIG. 13, or the X-direction shown in the inset on the right-hand side of FIG. 13) until the wire has entered the ingot 1330 by at least half the thickness of the sawing wires, D/2, for controlling the stress in the wire. After this initial phase, the motion of the wire-sawing web 1310 is controlled so as to maintain the movement in the vertical direction and to start a movement in a second direction perpendicular to the vertical movement, i.e. in the direction of the horizontal arrow in the left-hand side of FIG. 13 (which is parallel to the Y-direction shown in the inset on the right-hand side of FIG. 13). The combined movement of the wire-sawing web 1310 is maintained until the elbow in the asymmetric shape of the substrates 1350 has been cut. After this point, the movement of the wire-sawing web 1310 in the horizontal direction is stopped and proceeds only with the vertical movement, which is maintained through the rest of the ingot 1330, until reaching the stage 1340, so as to cut the main region of the substrates 1350. The combined movement of the wire-sawing web 1310 in the vertical and perpendicular directions during a selected amount of time and by a selected horizontal displacement allows to cut substrates 1350 with the desired asymmetric shape, such as shown on the right-hand side of FIG. 13.

Thus, similarly to the MWS process described with reference to FIG. 12, the controlled motion procedure illustrated in FIG. 13 allows to set/adjust the size and shape of the substrates 1350 by controlling and coordinating the movement of the wire-sawing web 1310 in the vertical and horizontal directions. For instance, the vertical displacement of the wire-sawing web 1310 during the time interval that it is also moved in the perpendicular direction determines the maximum distance between the substrate rim 650 that delimits the asymmetric region 610 and the end of the asymmetric region 610 (which approximately corresponds to the onset of the elbow 660), as shown in FIG. 15. On the other hand, the maximum height between the substrate rim 650, at the asymmetric region 610, and the reference plane 690, at the region of the substrate elbow 660, is determined by the total displacement of the wire-sawing web 1310 in the horizontal direction. Consequently, a specific size, shape and inclination of the asymmetric region 610 can be achieved by simply controlling the time duration and displacement of the roller 1310 in the transverse direction in coordination with the roller movement in the vertical direction.

The asymmetric shapes for improving stiffness of the SiC substrates illustrated in FIGS. 7 to 9 above can be obtained using any of the controlled motion procedures described with reference to FIGS. 12 and 13. Nonetheless, asymmetric shapes other than those illustrated in FIGS. 7 to 9 and which are based on the same principle of having a substantially flat main region, corresponding to a central area of the substrate, and an asymmetric region, located at a substrate peripheral area, that is inclined inwards towards the substrate front side, i.e. oriented out of the plane of the main region, may be envisaged for increasing substrate stiffness.

The two alternative MWS methods with controlled motion procedure illustrated in FIGS. 12 and 13 make possible to cut substrates with a given asymmetric shape. Nevertheless, a controlled motion procedure with other modifications/combinations of the movements executed by the stage and/or the wire-sawing web may be envisaged for cutting a same or other asymmetric shapes. For instance, the controlled motion procedures described with reference to FIGS. 12 and 13 may be modified so that the asymmetric region of the SiC substrates is not cut at the beginning, but rather by the end of the MWS process. The relative movement between the stage and the wire-sawing web may also result from a combination of a linear movement of the wire-sawing web with a rotational movement of the stage in order to cut a curved asymmetric region. In any of these cases, the MWS method with controlled motion procedure may be accomplished by implementing a MWS installation with a combination of mechanical means capable of producing the desired relative movement between the wire-guiding roller and the ingot stage (for e.g. to produce the vertical movement of the wire-guiding roller 1210 (or 1310), i.e. in a direction perpendicular to the surface of the stage 1240 (or 1340), and the movement of the stage 1240 (or the wire-guiding roller 1310) in the direction perpendicular to the wire-guiding roller vertical movement) and a controller for controlling such mechanical means to move the stage and/or the wire-guiding roller according to a software/routine specifying the amount, duration, and direction of the stage and/or of the wire-guiding roller movement for cutting the SiC substrates with the desired asymmetric shape, such as illustrated in FIGS. 12 and 13.

The principles of the present invention may be advantageously applied to improve stiffness of SiC substrates characterized by a total BOW value in the range of $-40$ µm to $0$ µm, preferably in the range of $-35$ µm to $0$ µm, and/or by a WARP value of less than $70$ µm, preferably with a WARP value of $45$ µm. Moreover, the SiC substrates with the asymmetric shape according to the present invention are preferably produced from a SiC monocrystal of one of the modifications 4H-SiC, 6H-SiC, and 15R-SiC, and/or with an off-axis orientation of the basal plane (1000), at the main region, between $0.5°$ to $8°$ off-axis orientation, and more preferably, with a $4°$ off-axis orientation.

In conclusion, the SiC substrates with an asymmetric geometry and methods of producing same according to the principles of the present invention make possible to provide SiC substrates with increased stiffness against thermally-induced deformations, such as warp and/or BOW. Thus, backside growth on the SiC substrates with the asymmetric geometry is efficiently reduced and localized at a substrate peripheral area, causing less negative impact on substrate BOW, in comparison with conventional flat substrates having symmetrical cross-sections.

Finally, although certain features of the above exemplary embodiments were described using terms such as "upwards", "inwards", "vertical" and "horizontal", these terms are used for the purpose of facilitating the description of the asymmetric shape of the substrates and the relative motion between plate and wire-guiding roller in the MWS process, and therefore, should not be construed as limiting the claimed invention or any of its components to their use on particular spatial orientation. Moreover, although the present invention has been described above with reference to monocrystalline SiC substrates, the principles of the present invention can also be advantageously applied to substrates made from other semiconductor monocrystals, such as AlN and GaN.

REFERENCE SIGNS

600, 700 asymmetric substrate
610, 710 asymmetric region
620, 720 main region
630, 730 front side
640, 740 backside
645 backside growth
650, 750 substrate rim
660 substrate elbow or shoulder

670 orientation notch
680 adjacent side of asymmetric region
690, 790 reference plane of main region
695 reference plane of asymmetric region
800 asymmetric substrate
810 asymmetric region
820 main region
840 backside
845 backside growth
860 substrate shoulder
900 asymmetric substrate
910 asymmetric region
920 main region
940 backside
945 backside growth
960 substrate shoulder
1000 conventional multi-wire sawing installation
1010 wire guiding roller
1020 wire-sawing web
1030 SiC ingot
1040 MWS stage
1050 wafers
1200, 1300 multi-wire sawing installation
1210, 1310 wire guiding roller or wire-sawing web
1230, 1330 SiC ingot
1240, 1340 MWS stage
1250, 1350 asymmetric wafers

The invention claimed is:

1. A monocrystalline SiC substrate with an asymmetric shape for enhancing substrate stiffness against thermal induced deformations, the monocrystalline SiC substrate comprising:

a main region with a substantially flat surface; and an asymmetric region located at a peripheral region of the substrate and adjacent to the main region, wherein the asymmetric region is inclined inwards, relative to a front side of the main region, to provide said asymmetric shape to the monocrystalline SiC substrate, wherein the asymmetrical region has the shape of a circular segment delimited between the adjacent main region and a rim of the substrate, wherein the asymmetric shape formed by the main region and the asymmetric region is provided by cutting the monocrystalline SiC substrate with said asymmetric shape from a SiC crystal.

2. The monocrystalline SiC substrate of claim 1, wherein the asymmetric region joins the main region in a continuous manner, the inclination between the asymmetric region and the main region defining a cross-section of the asymmetric shape with either a sharp bend or a rounded bend on a backside of the substrate.

3. The monocrystalline SiC substrate of claim 1, wherein the asymmetric region is so dimensioned and inclined inwards, relative to the main region, such that a maximum height of the substrate rim that delimits the asymmetric region is in the range of 15 μm to 60 μm with respect to a reference place of the main region.

4. The monocrystalline SiC substrate of claim 3, wherein said maximum height corresponds to a maximum height at an intersection of a reference plane of the asymmetric region with the substrate rim that delimits the asymmetric region, with respect to the reference plane of the main region, and/or said maximum height corresponds to 25 μm.

5. The monocrystalline SiC substrate of claim 1, wherein the asymmetric region is so dimensioned and inclined inwards, relative to the main region, such that a maximum distance between a projection, onto a reference plane of the main region, of the substrate rim that delimits the asymmetric region and the main region is in the range of 5 mm to 30 mm.

6. The monocrystalline SiC substrate of claim 3, wherein the reference plane of the main region corresponds to a median surface of the substrate without the peripheral region of the substrate, and/or the reference plane of the asymmetric region corresponds to a median surface of the asymmetric region; and/or said maximum distance corresponds to 15 mm.

7. The monocrystalline SiC substrate of claim 1, wherein the substrate is provided with an orientation flat or an orientation notch, the asymmetric region being located on the substrate peripheral area that is opposed to the orientation flat or the orientation notch, and the angular displacement of the asymmetric region is between ±90° with respect to the orientation flat or notch or notch.

8. The monocrystalline SiC substrate of claim 1, wherein the asymmetric region is so dimensioned and inclined inwards, relative to the main region, such that a maximum height of the substrate rim that delimits the asymmetric region, with respect to a Si-side of the substrate at the main region, is a positive height.

9. The monocrystalline SiC substrate of claim 1, wherein the substrate formed by the main and asymmetric regions is characterized by:

a BOW value in the range of −40 μm to 0 μm, and/or a WARP value of less than 70 μm.

10. The monocrystalline SiC substrate of claim 1, wherein the thickness of the asymmetric and main regions is in the range of 200 μm to 1000 μm, and/or the substrate has a partial cylindrical shape, at the main region, with a diameter d larger than 149.5 mm, and/or the substrate has a total thickness variation smaller than 5 μm, and/or at the main region, the SiC crystal structure has an a° off-axis orientation of the basal plane (1000) which is between 0.5° and 8° off-axis orientation.

11. The monocrystalline SiC substrate of claim 1, wherein said asymmetrical region has a substantially flat shape or a non-flat shape with a convex or a concave curvature.

12. The monocrystalline SiC substrate of claim 7, wherein the angular displacement of the asymmetric region with respect to the orientation flat or notch corresponds to ±60°.

13. The monocrystalline SiC substrate of claim 10, wherein the BOW value is in the range of −35 μm to 0 μm, and/or the WARP value corresponds to 45 μm.

14. The monocrystalline SiC substrate of claim 11, wherein said thickness of the asymmetric and main regions is in the range of 250 μm to 500 μm, and/or said α° off-axis orientation of the basal plane (1000) corresponds to a 4° off-axis orientation.

* * * * *